United States Patent [19]

Dao

[11] 3,838,393

[45] Sept. 24, 1974

[54] THRESHOLD LOGIC GATE

[75] Inventor: Tich T. Dao, Cupertino, Calif.

[73] Assignee: Signetics Corporation, Sunnyvale, Calif.

[22] Filed: Dec. 17, 1973

[21] Appl. No.: 425,217

[52] U.S. Cl......... 340/146.1 AG, 307/211, 328/215
[51] Int. Cl. . G06f 11/10, H03k 19/08, H03k 19/42
[58] Field of Search ............ 307/211; 328/115, 116, 328/117; 340/146.1 AG

[56] References Cited

UNITED STATES PATENTS 3,150,350 9/1964 Goldman.................. 340/146.1 AG
3,439,328 4/1969 Winder..................... 340/146.1 AG

*Primary Examiner*—Malcolm A. Morrison
*Assistant Examiner*—R. Stephen Dildine, Jr.
*Attorney, Agent, or Firm*—Flehr, Hohbach, Test, Albritton & Herbert

[57] ABSTRACT

A threshold logic gate is utilized for parity checking by providing two double threshold detectors responsive to logic levels provided by a level shifter which shifts the logical voltage levels produced by a differential amplifier which sums the four inputs.

6 Claims, 11 Drawing Figures

PRIOR ART 2 X 2 ECL

THRESHOLD LOGIC GATE

BACKGROUND OF THE INVENTION

The present invention is directed to a threshold logic gate and more particularly to a double threshold logic circuit which has special application as a parity checker.

Present four bit parity checkers as implemented in standard ECL logic require exclusive OR gates which in normal ECL logic are complex, expensive and have excessive time delay.

In addition, other types of complex Boolean functions are complex and have long time delays when implemented in conventional ECL logic.

OBJECTS AND SUMMARY OF THE INVENTION

It is, therefore, a primary object of the present invention to provide an improved logic gate using threshold logic principles for providing Boolean functions heretofore practically unobtainable by conventional ECL logic.

It is another more specific object of the invention to provide a threshold logic gate which performs four bit parity checking.

In accordance with the above objects, there is provided a threshold logic gate having a plurality of inputs and which is responsive to a predetermined number of unit inputs to provide a predetermined logic output signal. Differential switch means are responsive to such inputs for comparing each input to a reference and making a binary decision whether such input is higher or lower than the reference and for deriving complementary weighted currents in accordance with all of the binary decisions. Level shifter means are responsive to the complementary weighted currents for simultaneously producing a plurality of different threshold levels related to the weighted currents. Threshold detector means compare at least three of the levels to provide a logic output signal indicative of the predetermined number of unit inputs.

DETAILED DESCRIPTION OF THE PREFERRED EMBODIMENT

Figure 1:
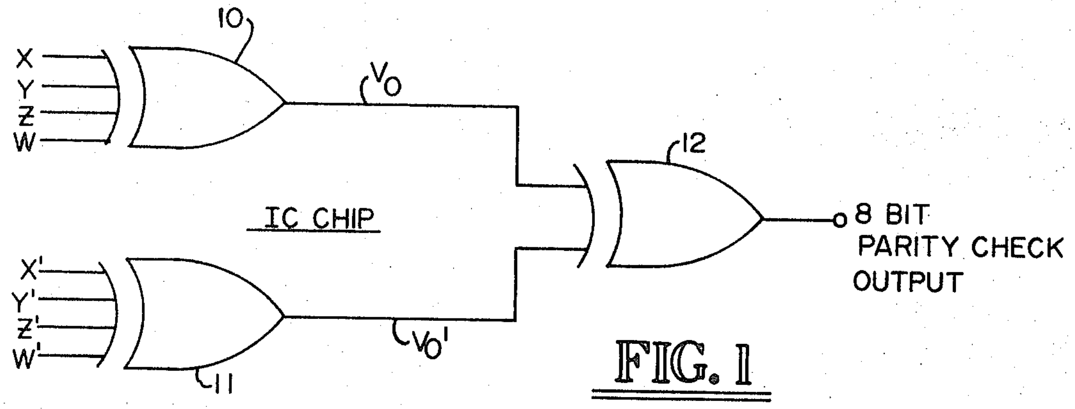
FIG. 1 is a logic diagram of the present invention.

FIG. 1 illustrates the invention as implemented as an eight bit parity checker on a single integrated circuit (IC) chip. It includes a first logical exclusive OR gate 10 for ORing the inputs X, Y, Z and W, and a second exclusive OR gate 11 for ORing the inputs X', Y', Z' and W'. These exclusive OR gates are in effect four bit parity checkers producing the outputs $V_0$ and $V_0'$, respectively. A third exclusive OR gate 12 ORs $V_0$ and $V_0'$ to provide an eight bit parity check output.

The basic building block of the present invention is a four bit parity checker. As expressed in terms of threshold logic, referring to FIG. 1A, the four bit parity checker 10 of FIG. 1 includes a double threshold logic circuit 10a which is responsive to four unit weight inputs X, Y, Z and W, and has an upward threshold on 1 and a downward threshold on 2 (see FIG. 4F). Similarly, portion 10b has an upward threshold if three inputs are present and a downward threshold with four inputs. These are coupled the OR gate 10c to produce the $V_0$ output which is X, Y, Z and W exclusively ORed together. The logic circuit of FIG. 1A, of course, alternatively, could be expressed as a quadruple threshold logic circuit. If the threshold logic of FIG. 1A were to be implemented in typical ECL logic, a two level exclusive OR gate system would be required as illustrated in FIG. 2. In other words, X is exclusively ORed with Y, Z is exclusively ORed with W and then the respective outputs A and B are again exclusively ORed. This is a typical $(2 \times 2)$ ECL delay. The present invention in FIG. 1A provides, in essence, a single level of time delay since the OR gate of 10C is practically speaking a wired OR type gate.

Figure 1A:
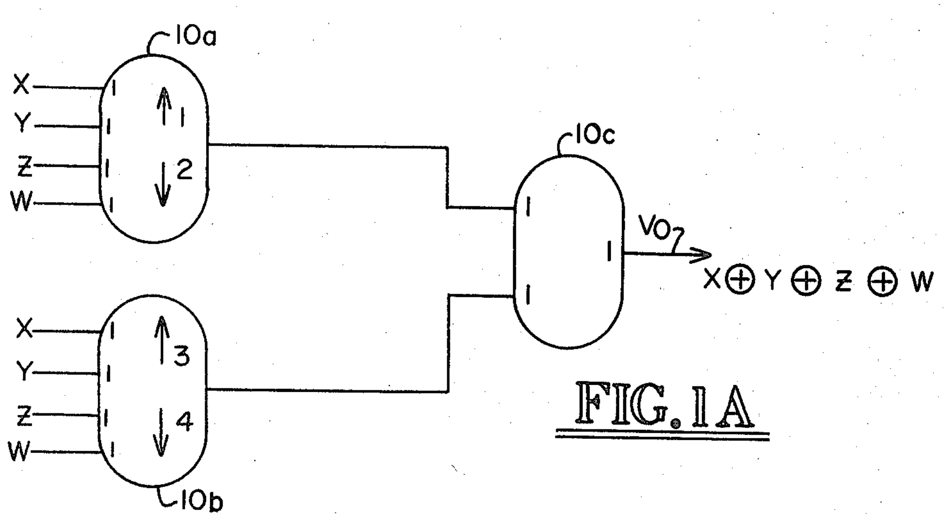
FIG. 1A is a logic diagram of FIG. 1 expressed in threshold logic terms.
Figure 2:
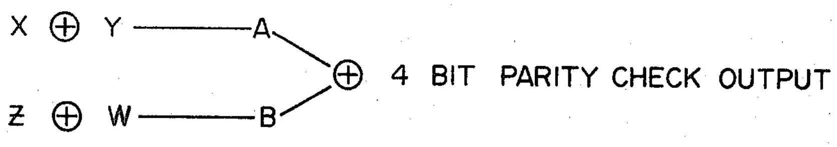
FIG. 2 illustrates the prior art.
Figure 3A:
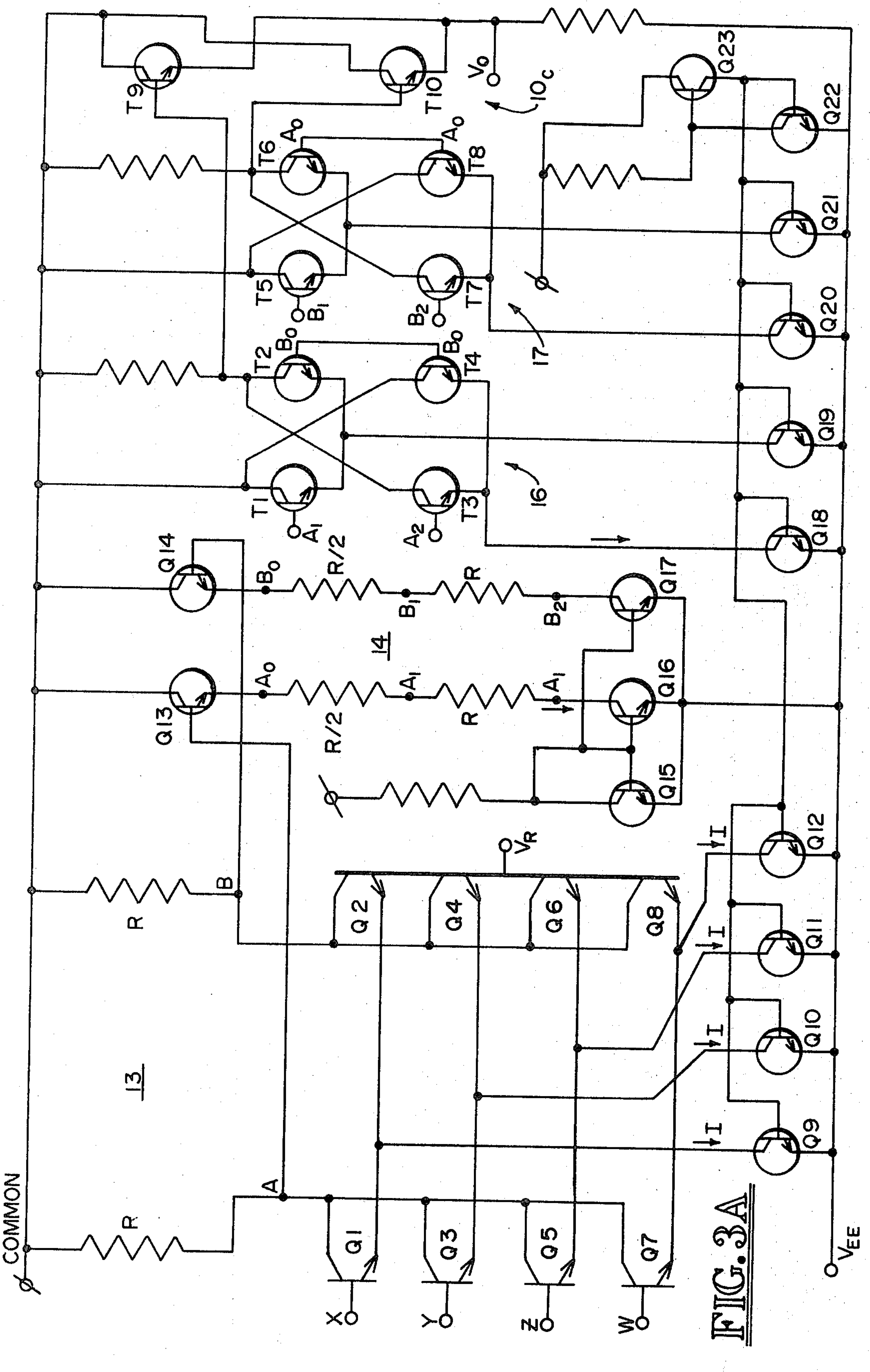
FIG. 3A is a detailed circuit schematic of a portion of FIG. 1 and FIG. 1A.

Referring now to FIG. 3A, this is the detailed circuit diagram of FIG. 1A. The four inputs, X, Y, Z and W are connected to a differential switch 13 which serves as a unit current weight driver. It includes four pairs of transistors (Q1, Q2), (Q3, Q4), (Q5, Q6), and (Q7, Q8). Each transistor pair forms a unit current weight driver as indicated in FIG. 1A corresponding to the inputs X, Y, Z and W. The collectors of transistors Q1, Q3, Q5 and Q7 are coupled together at node A and the collectors of Q2, Q4, Q6 and Q8 are coupled together at node B. Both nodes A and B are connected to common through identical resistors R. The bases of transistors Q2, Q4, Q6 and Q8 are connected to a reference voltage $V_R$. Q9, Q10, Q11 and Q12 are current sources each providing a current I and coupled to the respective emitters of the transistor pairs. Thus, the differential switch 13 will cause 4I to flow through the resistor R associated with node A with zero current through the resistor associated with node B or vice versa depending on the number of inputs which are true or in other words, are a binary 1, and the current will be appropriately shared. In other words, the differential switch serves as a logical summing device to provide voltages at nodes A and B which are representative of the number of on or true inputs.

The voltage levels at nodes A and B are coupled to level shifter means generally indicated at 14 which includes transistors Q13 and Q14 having their respective bases coupled to nodes A and B and with their emitters coupled to level shifting resistors designated R/2 and R having their threshold points $A_0$, $A_1$, and $A_2$ in the case of node A and transistor Q13 and $B_0$, $B_1$ and $B_2$ in the case of transistor Q14 and node B. Thus, the level shifter 14 is responsive to the complementary weighted currents through the resistors R of switch 13 which provide corresponding voltage drops at nodes A and B for simultaneously producing a plurality of different threshold levels related to the weighted currents.

Figures 3B, 4A, 4B, 4C, 4D, 4E, 4F:
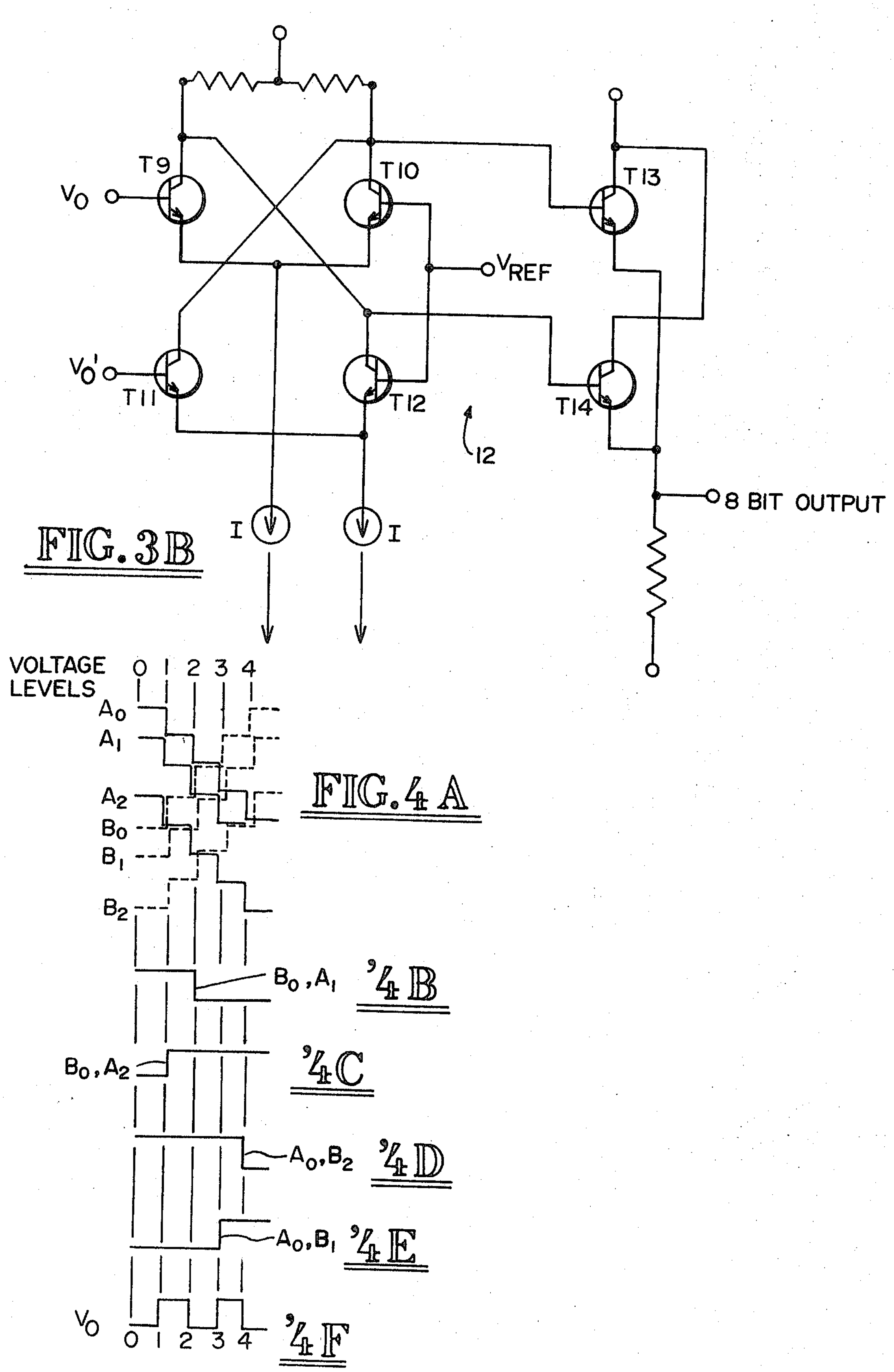
FIG. 3B is a detailed circuit schematic of another portion of FIGS. 1 and 1A.
FIGS. 4A through 4F are voltage level diagrams useful in understanding the invention.

Transistors Q15, Q16 and Q17 are coupled as current mirrors to provide for equal currents in transistors Q13 and Q14 in order that the threshold level points will be exactly complementary. These voltage levels are indicated in FIG. 4A by the solid lines for the A levels and the dashed lines for the B levels. It is apparent from FIG. 4A that the level step between the one and two subscripts is double that of the step between the 0 and 1 subscripts due to the resistor relationships. As will be discussed below, this provides for unambiguous switching levels.

Still referring to FIG. 3A, two double threshold detectors 16 and 17 are provided. Detector 16 includes transistors T1 through T4 and detector 17, transistors T5 through T8. The transistors are cross-coupled differential amplifiers. Their base input terminals are coupled to the similarly lettered threshold levels of the level shifter 14. A current mirror is provided by transistors Q22 and Q23 and transistors Q18 through Q21 are current sources for the threshold detectors 16 and 17.

Correlating FIG. 3A with FIG. 1A, threshold logic unit 10*a* of FIG. 1A corresponds to detector 16 in combination with the gate 13 and level shifter 14. Similarly, logic unit 10*b* corresponds to threshold detector 17 in combination with 13 and 14. The OR gate 10*c* is transistor T9 and T10 which produces the four bit parity output voltage $V_0$. To provide eight bit parity checking, the OR gate 12 (see FIG. 1) is shown in detail in FIG. 3B with the outputs of two four bit parity checkers, that is, $V_0$ and $V_0'$ coupled into a cross-coupled differential amplifier consisting of transistors T9 through T12 where the transistors T10 and T12 are coupled to a reference voltage $V_{ref}$ and drive an OR gate T13 and T14 to provide the final eight bit parity check output.

From an operational standpoint, the four bit parity checker portion of the invention as illustrated in FIG. 3A which produces the voltage $V_0$ as indicated in FIG. 4F operates in the following manner. As discussed above, threshold detectors 16 and 17 each serve as double threshold detectors. Thus, on receipt of one input as illustrated in FIG. 4C the $B_0$ $A_2$ threshold levels cause a switch as may be followed in FIG. 4A where the voltage waveforms $A_2$ and $B_0$ cross each other when one input is present. Similarly, a down threshold at the two input point is provided by the $B_0$ $A_1$ threshold levels as also shown in FIG. 4A. A combination of this up and down threshold thus produces the first portion of the $V_0$ waveform of FIG. 4F. Similarly, in the case of the up threshold level at 3 and down at 4, these are illustrated in FIGS. 4D and 4E and provided by the voltage threshold levels $A_0$, $B_2$ and $A_0$, $B_1$.

It is quite apparent that by proper choice of threshold levels, many other applications of the present invention could be made. For example, in a programmable logic array normally a product table is constructed which is termed a Shannon construction. However, with the present invention which provides a simple method of producing exclusive OR gates, what is termed a Reed-Muller canonical expansion may be made. Thus, in the case of a function of three variables X, Y and Z the following table would be constructe:. X; Y; Z; X exclusively ORed with Y; Y exclusively ORed with Z; X exclusively ORed with Z; X exclusively ORed with Z; and X exclusively ORed with Y exclusively ORed with Z.

Another feature of the present invention which is aptly illustrated in FIG. 4A is that by the use of one step between the 1 and 2 subscripts and two steps between the 1 and 2 subscripts an unambiguous cross-over is provided. This can be seen by inspection if an intermediate missing step is filled in.

Yet another feature of the present invention is its one level of time delay as opposed to the two or three or more levels of the prior art. Moreover, the speed of the circuit is enhanced by providing a sufficient switching current or voltage level which in terms of the circuit of FIG. 3A would would be $IR \geq V_{be}/2$. This provides for eight input parity checker switching speeds of less than 5 nanoseconds. Thus, the implementation as illustrated in FIG. 3A is optimum with four inputs since with the use of the four current sources the $V_{be}$ swing is divided into four portions; that is, $4IR \geq V_{be}$. However, in view of the fact that the differential or complementary voltage is utilized in the level shifted 14 the $V_{be}$ swing is actually doubled.

Thus, the present invention has provided an improved threshold logic device which is especially suitable for parity checking.

I claim:

1. A threshold logic gate having a plurality of inputs and responsive to a predetermined number of unit inputs to provide a predetermined logic output signal comprising: differential switch means responsive to said inputs for comparing each input to a reference and making a binary decision whether such input is higher or lower than said reference and for deriving complementary weighted currents in accordance with all of said binary decisions; level shifter means responsive to said complementary weighted currents for simultaneously producing a plurality of different threshold levels related to said weighted currents; threshold detector means for comparing at least three of said levels to provide said logic output signal indicative of said predetermined number of unit inputs.

2. A threshold logic gate as in claim 1 where said threshold detector means include cross-coupled differential amplifiers.

3. A threshold logic gate as in claim 1 where said threshold detector means includes a first portion responsive to three threshold levels and a second portion responsive to three other threshold levels said two portions having outputs coupled together by an OR type buffer gate to produce said predetermined logic output signal.

4. A threshold logic gate as in claim 3 where said gate is a four bit parity checker having four inputs said logic output signal being indicative of the parity of said four inputs.

5. A threshold logic gate as in claim 1 where said differential switch means includes a plurality of transistors each corresponding to an input with their collectors connected to a common resistive load, R, the current, I, through R being related to the $V_{be}$ of each transistor by $IR \geq V_{be}/2$.

6. A threshold logic gate as in claim 1 where said level shifter means provide a first shift of one step and a second shift of two steps.

* * * * *